(12) United States Patent
Higashikawa (10) Patent No.: US 6,765,673 B1
(45) Date of Patent: Jul. 20, 2004

(54) PATTERN FORMING METHOD AND LIGHT EXPOSURE APPARATUS

(75) Inventor: Iwao Higashikawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 483 days.

(21) Appl. No.: 09/615,605

(22) Filed: Jul. 13, 2000

(30) Foreign Application Priority Data

Jul. 16, 1999 (JP) ............................................ 11-203050

(51) Int. Cl.[7] .......................... G01B 11/00; G01B 11/14; G01N 21/00; G01N 21/88; G03B 27/42
(52) U.S. Cl. ................. 356/399; 356/237.4; 356/237.5; 356/620; 250/559.45; 355/53
(58) Field of Search ................................ 356/399, 400, 356/237.5, 620, 237.3, 237.2, 237.4, 237.1, 401; 250/461.1, 459.1, 559.41, 559.45, 559.4; 355/30, 53

(56) References Cited

U.S. PATENT DOCUMENTS

| | | | |
|---|---|---|---|
| 5,015,866 A | * | 5/1991 | Hayashi ...................... 250/548 |
| 5,235,400 A | | 8/1993 | Terasawa et al. |
| 5,539,514 A | * | 7/1996 | Shishido et al. ......... 356/237.4 |
| 6,381,873 B1 | * | 5/2002 | Peremychtchev et al. ..... 34/497 |
| 6,504,609 B2 | * | 1/2003 | Nara et al. ................... 356/394 |
| 6,526,164 B1 | * | 2/2003 | Mansfield et al. .......... 382/144 |

* cited by examiner

Primary Examiner—Russell Adams
Assistant Examiner—Magda Cruz
(74) Attorney, Agent, or Firm—Finnegan, Henderson, Farabow, Garrett & Dunner, L.L.P.

(57) ABSTRACT

Disclosed is a pattern forming method, in which a mask blank for preparation of a photomask is exposed in a desired pattern to form a mask pattern on the mask blank. Position measuring marks are formed on the diagonally facing corners of a main surface of the mask blank to detect a defect on the main surface of the mask blank. The relative positions of the detected defect and the mask pattern that is to be formed on the mask blank are compared, and the pattern position is selected such that the defect overlaps with the pattern. Then, the position measuring marks are measured to calculate the exposure position, and exposure treatment is applied to the selected position.

21 Claims, 5 Drawing Sheets

PATTERN FORMING METHOD AND LIGHT EXPOSURE APPARATUS

CROSS-REFERENCE TO RELATED APPLICATIONS

This application is based upon and claims the benefit of priority from the prior Japanese Patent Application No. 11-203050, filed Jul. 16, 1999, the entire contents of which are incorporated herein by reference.

BACKGROUND OF THE INVENTION

The present invention relates to a method of forming a fine pattern, particularly, to a pattern forming method for forming a pattern of, for example, LSI by exposing an original plate such as a photomask to light. The present invention also relates to a light exposure apparatus for working the pattern forming method of the present invention.

In a photolithography technology for transferring a pattern of a mask onto a sample such as a wafer, it is ideal for the mask not to have a defect. The mask of this kind is manufactured by preparing a mask blank free from a defect or having a defect smaller than a predetermined value, carrying out a pattern forming process, and performing a defect inspection and repair to eliminate the defect in a manner to satisfy the defect supervising standard.

Where the mask blank is not free from a defect, the frequency of the defect occurrence is increased, leading to an increased defect inspection-repair treatment. Where the repair accuracy is insufficient, it is necessary to manufacture again the mask by using a new mask blank. In this case, the defective mask blank, which is costly, must be discarded. When the defect derived from the mask blank takes place on the contour portion of the pattern, it is large possibility to be the one which is not to be repaired.

In recent years, the demands for the defect level of the mask blank have become severer and severer in accordance with miniaturization of the pattern so as to make the manufacturing technology of the mask blank markedly difficult and to invite an increase in the manufacturing cost. Also, in the reflection type mask blank using a multi-layered film, the repair technology itself has become difficult and the kinds of the defects that cannot be corrected are on the increase.

As described above, if a defect is present in a substrate that is to be exposed to light such as a mask blank, the mask prepared by forming a pattern on the substrate is caused to bear a defect. If the pattern is transferred onto, for example, a wafer by using the mask, the manufacturing yield is lowered by the influences given by the defect. Also, it is very difficult to prepare a mask blank perfectly free from a defect, and the utilization of the mask blank is markedly lowered if the mask blank having a defect is not used.

The problems described above are prominent in the case of using a costly material such as a mask blank as a substrate that is to be exposed to light and in the case of transferring a pattern onto a sample such as a wafer by light exposure.

BRIEF SUMMARY OF THE INVENTION

An object of the present invention, which has been achieved in view of the situation described above, is to provide a pattern forming method that permits forming a pattern while avoiding a defective portion of a substrate that is to be subjected to light exposure so as to improve the manufacturing yield and to effectively utilize the substrate such as a mask blank.

Another object of the present invention is to provide a light exposure apparatus for easily working the pattern forming method of the present invention.

According to a first aspect of the present invention, there is provided a pattern forming method, in which a desired pattern is exposed on to a surface of a substrate to form a pattern on the substrate surface, comprising the steps of:

detecting a defect on the substrate surface;

analyzing the mutual positional relationship between the detected defect and a pattern to be formed on the substrate surface; and based on the result of the analysis, correcting the pattern position in the step of pattern exposing on to the substrate surface in the pattern.

According to a second aspect of the present invention, there is provided a pattern forming method, in which a main surface of a mask blank used for preparation of a photomask is exposed in a desired pattern to form a mask pattern on the mask blank, comprising the steps of:

forming position measuring marks on at least two points on a main surface of the mask blank;

detecting a defect on the main surface of the mask blank and obtaining defect analysis data including at least the kind of the defect and the position of the defect relative to the position measuring marks;

comparing the obtained defect position with the relative position of the mask pattern that is to be formed on the mask blank so as to select the mask arranging position relative to the mask blank; and measuring the position measuring mark to calculate the light exposure position and applying an exposure treatment to the selected position.

In the present invention, it is desirable to correct or select the pattern arranging position such that a defect is not located in a pattern edge.

The mask blank comprises a transparent substrate and a light-shielding film formed on the transparent substrate, and the defect comprises a black type defect and a white type defect. It is desirable to select the pattern arranging position such that the black type defect is buried in the light shielding film pattern and the white type defect is positioned in a pattern opening that is surrounded by the light shielding film pattern.

Further, according to a third aspect of the present invention, there is provided an exposure apparatus, comprising:

means for exposing a substrate surface in a desired pattern;

means for detecting a defect on the surface of the substrate;

means for analyzing the mutual positional relationship between the defect detected by the detecting means and a pattern that is to be formed on the surface of the substrate; and means for correcting the pattern position in the step of exposing the substrate surface in the pattern based on the result of the analysis.

According to the present invention, a defect on a surface of a substrate that is to be exposed to light is detected in advance and the pattern position in the step of light-exposing the pattern to be formed on the substrate is corrected based on the kind, position, etc. of the defect. As a result, it is possible to perform a pattern formation in a manner to avoid the defective portion of the substrate, making it possible to manufacture efficiently the mask or the like that is free from a defect or in which an influence of a defect does not appear.

To be more specific, a defect in a substrate itself is accepted, and the defect is made substantially invisible after formation of a pattern by light exposure. For example, in the case of a mask blank having a light shielding film formed on a transparent substrate, a black type defect is buried in the light shielding film pattern, and a white type defect is exposed to a pattern opening in which the light shielding pattern is not present so as to make these defects invisible when a mask is prepared. Also, if the defect is not positioned in a contour portion of the pattern, the defect can be corrected easily by, for example, a laser repair.

In the present invention, the light exposure apparatus itself is provided with a mechanism for detecting a defect in a substrate that is to be exposed to light, making it possible to perform the defect detection, the pattern position correction and the patterned light exposure without moving the substrate among different apparatuses. It follows that a mask that is not affected by a defect can be manufactured easily.

As described above, the present invention makes it possible to form a pattern in a manner to avoid a defective portion of the substrate, leading to an improved manufacturing yield and an effective utilization of the substrate such as a mask blank.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described in detail with reference to the accompanying drawings.

EXAMPLE 1

In this Example, the technical idea of the present invention is applied to the manufacture of a multi-layer film reflection type mask. And in this Example, the exposure is performed by electron beam.

The multi-layer film reflection type mask in this Example is a mask reflecting an EUV light having a wavelength of about 13 nm. The mask is of a laminate structure consisting of a Mo/Si multi-layer film formed as a reflecting layer on a substrate, a $SiO_2$ film formed on the multi-layer film, and a Ta film formed on the $SiO_2$ film as an absorption layer shielding the light, and is prepared by patterning the Ta film.

Figure 1A:
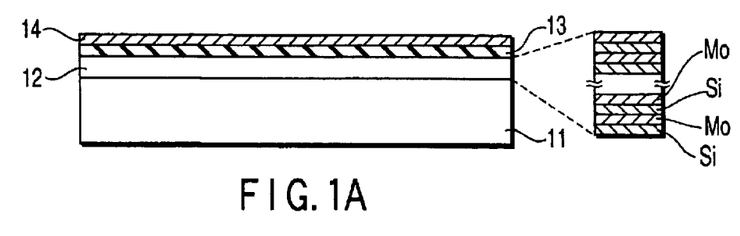
FIGS. 1A to 1D are cross sectional views collectively showing a pattern forming process for manufacturing a multi-layered reflection type mask according to Example 1 of the present invention.
Figure 1B:
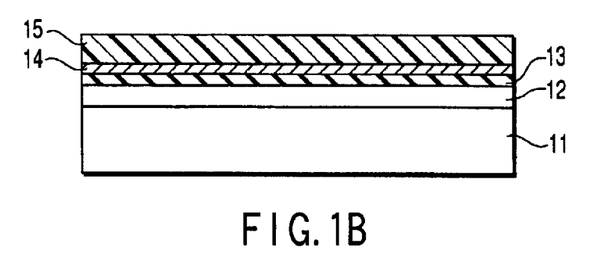
Figure 1C:
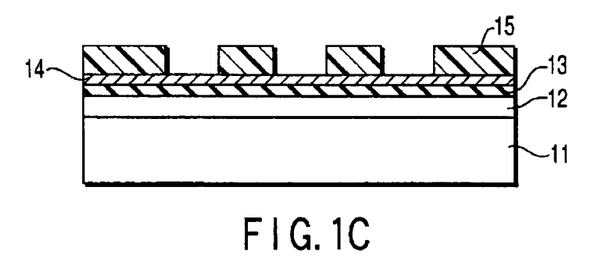
Figure 1D:
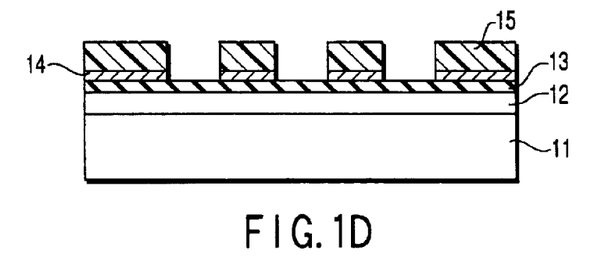

In manufacturing the multi-layer film reflection type mask, prepared first is a mask blank as shown in FIG. 1A. As shown in the drawing, a Mo/Si multi-layer film 12 is deposited on a substrate 11, followed by forming a $SiO_2$ film 13 on the multi-layer film 12 and subsequently forming a Ta film 14 on the $SiO_2$ film 13 so as to obtain a mask blank. In the next step, a positive resist film 15 is formed in a thickness of 0.3 µm on the Ta film 14, followed by applying a predetermined baking treatment to the resist film 15. Then, the resultant substrate is set on a stage within a vacuum chamber of a light exposure apparatus that is to be described herein later.

Where a defect of the mask blank is not taken into account, the resist film 15 is exposed to light in a mask pattern, followed by a developing treatment to form a resist pattern, as shown in FIG. 1C. Then, the Ta film 14 is selectively etched with the pattern of the resist film 15 used as a mask, as shown in FIG. 1D, followed by removing the resist film 15, thereby finish manufacture of a multi-layer film reflection type mask.

On the other hand, in Example 1 of the present invention in which the defect of the mask blank is taken into account, the following process is employed. Specifically, in the light exposure apparatus, the stage is driven while scanning a laser beam on a substrate, and the scattered light is detected for detecting the defect of the substrate. Then, the location, kind and shape of the defective portion are confirmed by using an optical microscope or the like mounted on the light exposure apparatus.

In the mask blank used in Example 1, three defects of the substrate, in which a foreign matter is considered to be taken into the multi-layer film, were detected in a region of 100 mm×100 mm that was to be exposed to light in a pattern. After the shapes and locations of the defects were confirmed by the optical microscope, the positional relationship between the defective portions and the pattern data was confirmed. Two of the defects, when the pattern region was arranged to conform with the center of the pattern region, were positioned in the contour portion of the opening of the pattern.

Therefore, the shift amount of the entire patterned light exposure for arranging the defective portion not to be positioned in the region exposed to light was calculated by moving the light exposure position of the pattern on the substrate to permit the defective portion to be present in the non-light exposure portion. For calculating the shift amount, the exposed portion was moved appropriately by several micrometers in x- and y-directions so as to examine the relative relationship between the defective portion and the pattern, and the relative position was compared to see whether all the defects detected are positioned in the region where the Ta pattern is left unremoved, i.e., the region not exposed to light. One arrangement in which all the defects are positioned in the region not exposed to light and positioned at least 0.2 μm inside the contour of the pattern was found to be on the coordinate moved by 0.7 μm in the x-direction and by 2.3 μm in the y-direction.

Then, the pattern exposure treatment was performed on the basis of the pattern data. The light exposure treatment was performed by shifting the original position by 0.7 μm in the x-direction and by 2.3 μm in the y-direction. Also, the exposure was performed by using a vector scan type electron beam exposure apparatus employing an accelerating energy of 50 keV and a variable shaped beam and by using the electron beam exposure data having a proximity effect correcting treatment applied thereto.

After the pattern exposure, a post exposure baking treatment was applied, followed by applying a developing treatment. The formed resist pattern was inspected and compared with a pattern data. Then, a post baking treatment was applied, followed by etching the Ta film by an anisotropic etching using a mixed gas containing a chlorine gas, an oxygen gas, an argon gas and a helium gas. The resist pattern was removed and, then, a washing was applied, followed by inspecting the defect. A defect not smaller than 0.1 μm was not found in a pattern region of 100 mm square.

Figure 2A:
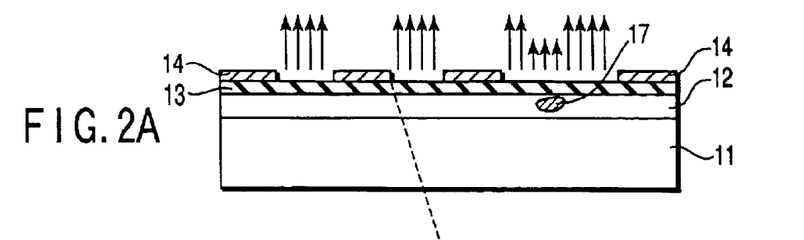
FIGS. 2A and 2B are cross sectional views showing how the influence of the defect within a multi-layered film is avoided in Example 1 of the present invention.
Figure 2B:
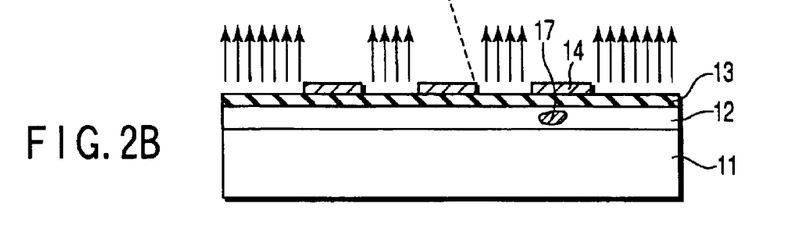

FIGS. 2A, 2B, 3A and 3B are cross sectional views exemplifying how to avoid the influence of the defect present in the mask blank. As shown in FIG. 2A, a defect 17 is present in the Mo/Si multi-layer film 12. If the defect portion is positioned in the open portion of the Ta film 14, the reflectance is lowered by the defect 17. The lengths of the arrows shown in the drawing correspond to the reflectance. It should be noted that the influence of the defect 17 can be eliminated by shifting the pattern position such that the defect 17 is covered with the Ta film 14 as in Example 1 of the present invention, as shown in FIG. 2B.

Figure 3A:
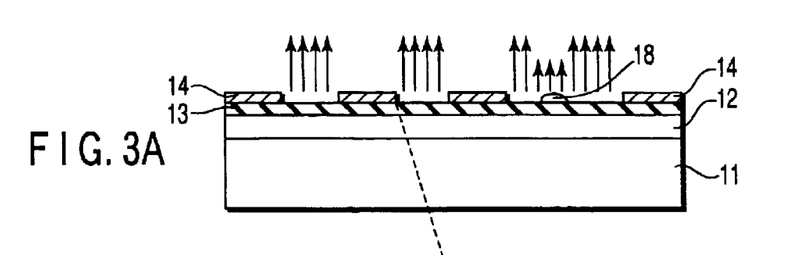
FIGS. 3A and 3B are cross sectional views showing. how the influence of the defect on a Ta film is avoided in Example 1 of the present invention.
Figure 3B:
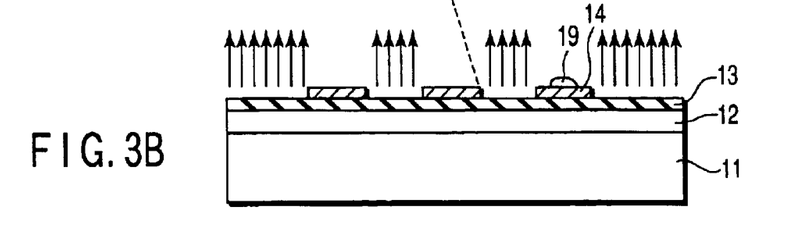

Also, if dust is attached to the Ta film 14 and if the dust is positioned in the open portion of the Ta film 14, the Ta film is not completely removed in the etching step of the Ta film 14 so as to remain as a defect 18, as shown in FIG. 3A. The defect 18 invites a decreased reflectance. On the other hand, the influence of an attached defect 19 can be eliminated by shifting the pattern position such that the defect is positioned on the remaining portion of the Ta film 14 as in Example 1 of the present invention, as shown in FIG. 3B.

In any of the examples shown in FIGS. 2A, 2B, 3A and 3B, a defect is not removed. However, a pattern is formed so as not to allow the influence of the defect to appear on the light exposure mask, which is equivalent to elimination of the defect.

EXAMPLE 2

Figure 4:
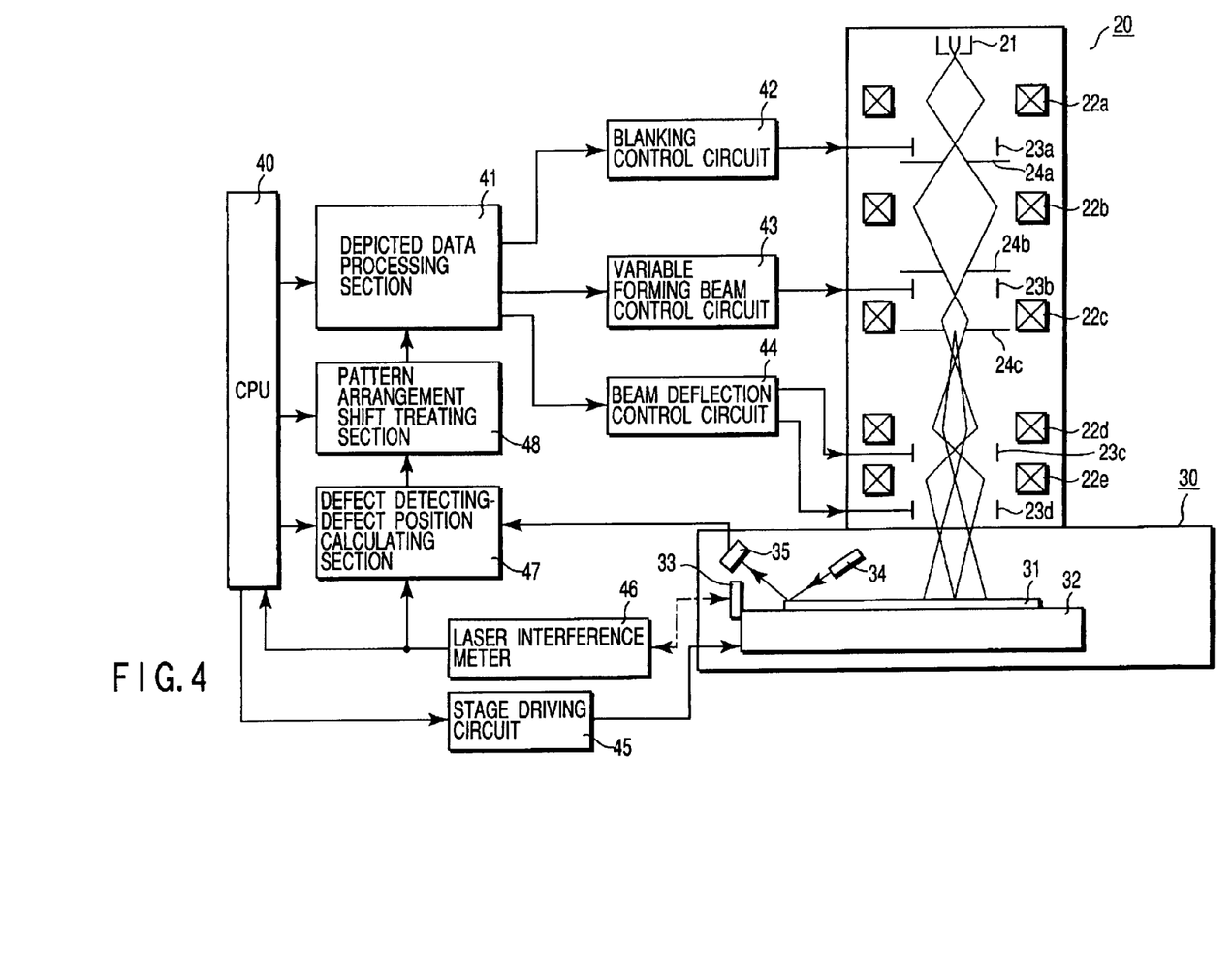
FIG. 4 schematically shows the construction of an electron beam exposure apparatus of the present invention.

FIG. 4 schematically shows the construction of an electron beam exposure apparatus according to Example 2 of the present invention.

As shown in the drawing, the apparatus comprises a electron beam column 20 including an electron gun 21, a lens system 22 (22a to 22e), a deflection system 23 (23a to 23d) and an aperture mask 24 (24a to 24c). The apparatus also comprises a sample chamber 30. An XY stage 32 on which a substrate 31 that is to be exposed to electron beam is arranged within the sample chamber 30. A mirror 33 for a laser interference is mounted to one side of the stage 32. Two mirrors are mounted for X and Y directions. Also, a laser light source 34 for irradiating the substrate 31 with a laser light and a defect detector 35 for detecting the light reflected from the substrate 31 are arranged within the sample chamber 30.

The shape and size of the electron beam emitted from the electron gun 21 are controlled by a shaping deflector 23b and shaping apertures 24b and 24c, and the shaped beam is projected onto the substrate 31 disposed on the stage 32 arranged within the sample chamber 30. The electron beam is deflected by scanning deflectors 23c, 23d onto a desired position on the substrate and turned on or off by a blanking deflector 23a and a blanking aperture mask 24a so as to control the amount of the electron beam exposure.

The electron beam exposure apparatus shown in FIG. 4 also comprises a CPU 40, a depicted data processing section 41, a blanking control circuit 42, a variable forming beam control circuit 43, a beam deflection control circuit 44, a stage driving circuit 45, laser interference meters 46, a defect detecting defect position calculating section 47, and a pattern arrangement shift treating section 48.

The electron beam exposure apparatus shown in FIG. 4 is equal in its basic construction to the conventional electron beam exposure apparatus. However, the apparatus of the present invention differs from the conventional apparatus in that the apparatus of the present invention comprises the laser light source 34 and the defect detector 35 for detecting the defect on the surface of the substrate 31 that is to be exposed to the electron beam, the defect detecting-defect position calculating section 47 for detecting the defect from the detection signal of the defect detector 35 and for calculating the defect position, and the pattern arrangement shift treating section 48 for comparing the defect position obtained by the defect detecting-defect position calculating section 47 with the position of the depicted pattern so as to shift the pattern position in a manner to eliminate the influence of the defect.

According to the particular construction, the substrate 31 to be exposed to the electron beam (i.e., the mask blank described in conjunction with Example 1) is transferred so as to be disposed on the stage 32. Then, a laser light emitted from the laser light source 34 is scanned on the substrate surface and the reflected light is detected by the detector 35. The detected signal is processed by calculating section 47 so as to obtain analytical data of the defect such as the position, kind and shape of the defect.

Based on the analytical data of the defect, the pattern position is corrected by the pattern arrangement shift treating section 48 such that all the black type defects fall within the non-exposed region and all the white type defects fall within the electron beam-exposed region. By supplying the corrected data to the depicted data treating section 41, it is possible to perform the pattern exposure similar to that in Example 1, making it possible to form a photomask free from the influence of the defect.

As described above, the defect detection, the pattern position correction and the patterned exposure relative to the mask blank described in conjunction with Example 1 can be performed within a single apparatus in Example 2 by providing the exposure apparatus itself with a defect detecting mechanism. As a result, the process for the pattern formation can be performed easily in a short time.

EXAMPLE 3

In Example 3, the technical idea of the present invention is applied to the manufacture of a photomask used as an original plate in the transfer in a light exposure apparatus having a diminished optical system.

The mask blank used for preparation of the photomask comprises a quartz glass substrate called 6025 standard and a laminate structure consisting of a chromium film and a chromium oxide film that are formed on the main surface of the substrate. It is unavoidable for defects such as pin holes to be generated in the manufacturing process of the mask blank. Therefore, defects of the mask blank were inspected first so as to confirm the presence of the defects.

Figure 5:
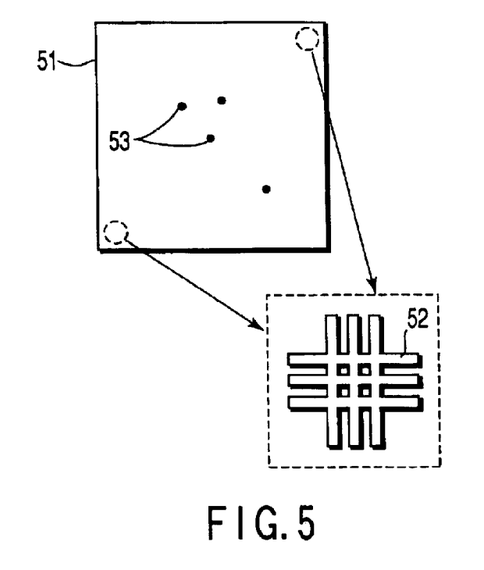
FIG. 5 is a plan view showing a mask blank and an alignment mark used in Example 3.

A defect sized about 0.5 μm was recognized in substantially the center of the substrate. Lattice-shaped patterns were marked by using a laser repair apparatus in positions each about 4 mm apart in each of x- and y-directions from each of the diagonally facing corners of the substrate. FIG. 5 is a plan view showing the construction of the mask blank. In the drawing, a reference numeral 51 denotes the mask blank, a reference numeral 52 denotes the lattice-shaped pattern (alignment mark), and a reference numeral 53 denotes defects.

Then, the positions of the defects and the positions of the lattice-shaped patters 52 marked at two positions were measured by using a pattern position measuring apparatus. The relationship between the position of the defect and the position of the light-exposed pattern in the case of arranging the region of the light-exposed pattern in the center of the substrate with the lattice-shaped patterns at the corners of the substrate used as the criterion was calculated by using the coordinates thus obtained with reference to CAD data. The defect position was found to be in contact partly with the edge of the pattern.

Then, the adjacent patterns are examined and it is expected that the pattern is moved by 2.0 μm in the x-direction and by −3.5 μm in the y-direction, the defect is positioned substantially in the center of the opening of the pattern, thereby removing the defect in the manufacturing process. It is also expected that a convex defect, which is considered to consist of dust or the like, is positioned sufficiently away from the edge of the opening, can be corrected easily, with the result that the convex defect does not remain finally as a defect.

Figure 6A:
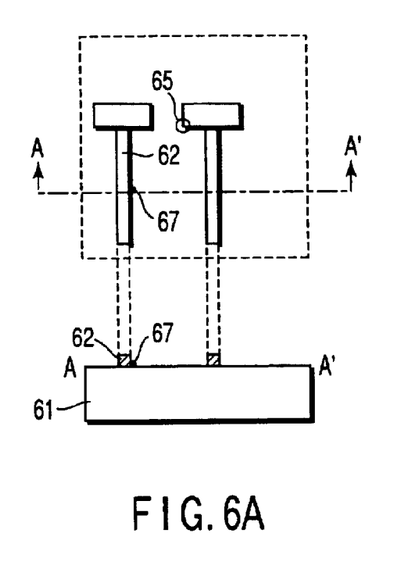
FIG. 6A is a plan view showing how the influence of a pin hole defect is avoided in Example 3.
Figure 6B:
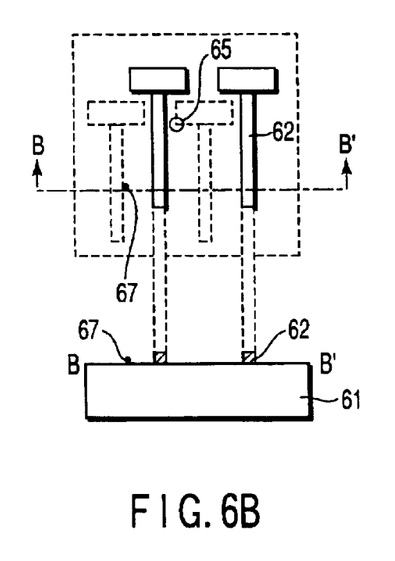
FIG. 6B is a cross sectional view showing how the influence of a pin hole defect is avoided in Example 3.

FIGS. 6A and 6B schematically show the relationship between the pattern that is to be formed in the mask blank and the defect. Shown in these drawings are a transparent substrate 61 constituting a mask blank, a pattern 62 made of a light shielding film, a white type defect 65 such as a pin hole defect, and a black type defect 67 such as dust.

FIG. 6A shows the state before the correction. As already described, the pin hole defect 65 is partly in contact with the edge of the pattern 62. FIG. 6B shows the state after the correction. It is seen that the pin hole defect 65 is positioned substantially in the center of the opening of the pattern. Also, the defect 67, which was in contact with the pattern 62 before the correction as shown in FIG. 6A, is positioned apart from the pattern 62 after the correction as shown in FIG. 6B. The defect 67 apart from the pattern can be removed easily by the ordinary correcting method.

In the next step, the mask blank was washed, followed by treating the mask blank with a vapor of hexamethyl disilazane and subsequently coating the mask blank with photo resist (ip 3500 manufactured by TOK Inc.) in a thickness of 0.5 μm. Further, the mask blank was baked with a hot plate.

Then, the mask blank was set in a laser writing apparatus, and the positions of the lattice-shaped patterns at two positions were measured. Further, the entire pattern region was shifted from the predetermined position based on the positions of the lattice-shaped patterns by 2.0 μm in the x-direction and by −3.5. μm in the y-direction, and the light exposure treatment was performed under this condition. After the light exposure treatment, a developing treatment was applied, followed by applying a dry etching treatment and then stripping off the resist pattern. Further, after a washing treatment, the defect was inspected.

Black type defects, which are considered to accompany an abnormality of the resist pattern, were detected in positions clearly differing from the black type defect positions of the mask blank. However, these detected black type defects were isolated defects that can be removed by applying a repair technology. The black type defect was eliminated by using a laser repair apparatus. Further, after a washing treatment, a pellicle was mounted. Then, after the printing treatment onto the resist pattern on a Si substrate, which was performed by using a reduction optical exposure apparatus, the defect of the printed resist pattern was inspected. No defect that was considered to be derived from the photomask was detected, and the mask was found to be free from a defect.

FIGS. 7A to 7C and 8A to 8C are plan views showing examples of avoiding the influence of the defect present in the mask blank.

Figure 7A:
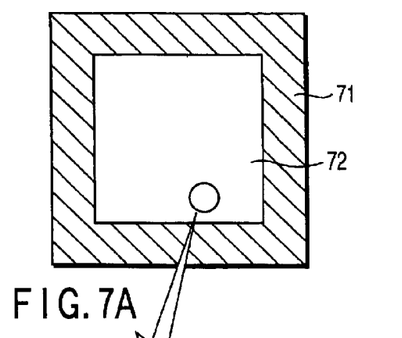
FIGS. 7A to 7C are plan views collectively showing how the influence of a black type defect is avoided in Example 3.
Figure 7B:
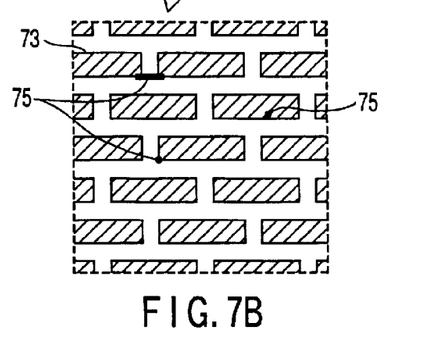
Figure 7C:
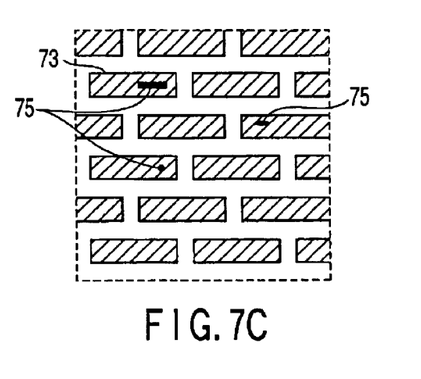

FIG. 7A shows the entire construction of the mask. As shown in the drawing, the mask includes a light shielding region 71 and a pattern region 72. FIGS. 7B and 7C show in a magnified fashion a part of the pattern region. As shown in FIG. 7B, two of, for example, three black type defects 75 are in contact with edges of light shielding patterns 73. It is difficult to correct the defects 75 in contact with the edge of the patterns 73.

In Example 3, all the defects 75 can be covered with the light shielding patterns 73 as shown in FIG. 7C by deviating the pattern position in x- and y-directions as described previously. As a result, the influence of the defects 75 can be eliminated.

Figure 8A:
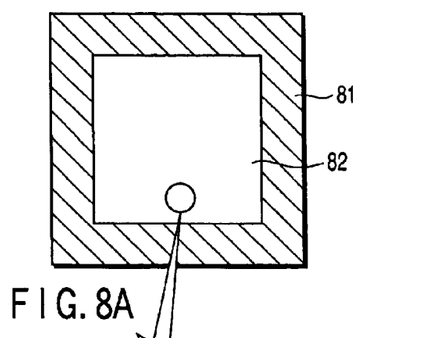
FIGS. 8A to 8C are plan views collectively showing how the influence of a black type defect is avoided in Example 3.
Figure 8B:
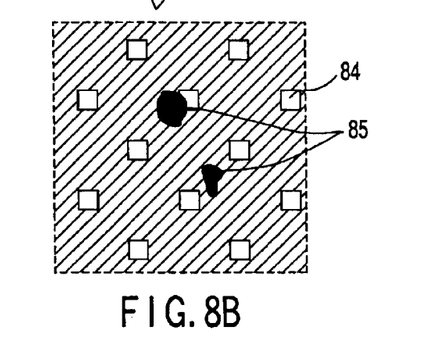
Figure 8C:
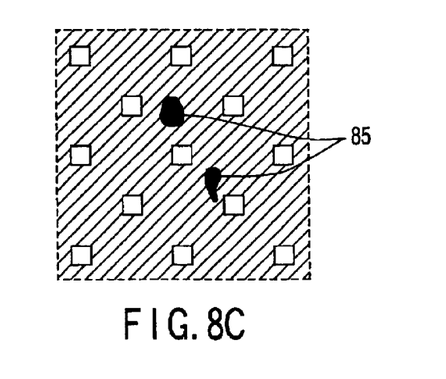

FIG. 8A shows the entire construction of the mask. As shown in the drawing, the mask includes a light shielding region 81 and a pattern region 82. FIGS. 8B and 8C show in a magnified fashion a part of the pattern region. As shown in FIG. 8B, a black type defects 85 are in contact with parts of the opening patterns 84 formed below the light shielding layer. It is difficult to correct the defect in contact with an edge of the pattern.

In Example 3, all the defects 85 can be covered with the light shielding portion as shown in FIG. 8C by deviating the pattern position in x- and y-directions as described previously. As a result, the influence of the defects 85 can be eliminated.

In the present invention, it is simplest and desirable to move the position of the pattern arrangement by shifting the pattern in the x- and y-directions. Alternatively, it is possible to swing the substrate or the entire light exposed pattern by 90°, 180° or 270° for moving the position of the pattern arrangement. Further, it is possible to-apply traces of swinging in addition to the shifting in the x- and y-directions within the technical scope of the present invention.

Concerning the positional relationship between the defect and the light exposed pattern data, it is desirable for the defect to be away from the edge of the pattern. To arrange a defect in a position at which the defect can be repaired in place of covering the defect with a pattern falls within the technical scope of the present invention. In other words, if the defect is away from the edge, the defect can be repaired without worrying about the accuracy of the repair.

In the exposure apparatus of Example 3, the defect inspection, the measurement of the defective position and the exposure treatment are carried out by different units. However, a simpler construction can be achieved by collectively performing these functions as in Example 2. Also, the technical idea of the present invention can also be applied to the case where defects are generated by dust generated in, for example, the coating process.

In Example 3, marks are arranged for measuring the positional relationship between the substrate and the defect. In this case, the number of marks is not limited to two. It is possible to improve the measuring accuracy of the substrate position by using a plurality of marks, and it is considered necessary to use at least two marks. Also, these marks need not be arranged at the corner portions of the substrate and need not remain unremoved finally. Further, the effect of the present invention is not impaired at all, if the region including the mark is made an open portion in the manufacturing process.

In Example 3, the marks were formed by processing a thin film formed on the substrate. However, a similar effect can be obtained in the case of forming patterns on the thin film or in the case of applying a processing to the main surface to form marks prior to formation of a thin film or a multi-layer film.

Further, where it is impossible to avoid the defect occurrence by the combination of the position or shape of the defect with a predetermined exposure pattern, it is conceivable to employ the following technology. For example, the possibility of avoiding the defect is examined by changing the exposure pattern, or the defect occurrence is avoided by using another mask blank. These measures constitute examples of the measures that make the present invention effective. In the Examples of the present invention, the defect is compared with a pattern for changing the pattern position. However, the pattern position need not be changed at all if the defect is judged not to generate a problem after the processing.

The Examples described above are directed to a mask blank for forming a photomask. However, the technical idea of the present invention can also be applied to the case of exposing the ordinary wafer to light as well as to the mask blank. For example, a defect detection is applied immediately after coating of a wafer with a resist so as to detect the defect such a pin hole of the resist film, and the pattern position is shifted in the step of applying a light exposure by using a stepper based on the detected information. The present invention can be worked in various exposure technologies including light exposure, X-ray exposure, electron beam exposure, ion beam exposure, so on.

Further, the present invention can be worked in variously modified fashions within the technical scope of the present invention.

As described above in detail, the present invention provides a pattern forming method that permits a pattern formation while avoiding the defective portion of the substrate that is to be subjected to exposure, making it possible to improve the yield of manufacture and to utilize effectively the substrate that is to be subjected to exposure such as a mask blank. The present invention also provides an exposure apparatus for easily working the pattern forming method of the present invention.

The present invention makes it possible to improve the yield of manufacture and to utilize effectively the substrate that is to be subjected to exposure such as a mask blank. Also, the pattern formation can be performed easily by providing the exposure apparatus itself with a defect detecting mechanism.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method, in which a desired pattern is exposed on to a surface of a substrate to form a pattern on the substrate surface, comprising the steps of:
   detecting a defect on said substrate surface;
   analyzing the mutual positional relationship between the detected defect and a pattern to be formed on said substrate surface; and
   based on the result of the analysis, correcting the pattern position in the step of pattern exposing on to said substrate surface in said pattern.

2. The pattern forming method according to claim 1, wherein the arranging position of the pattern is corrected such that the defect is not positioned in an edge of the pattern.

3. The pattern forming method according to claim 2, wherein the pattern position is corrected by shifting the pattern position in x- and/or y-directions.

4. The pattern forming method according to claim 2, wherein the pattern position is corrected by swinging the pattern position by 90°.

5. The pattern forming method according to claim 2, wherein the pattern position is corrected by swinging the pattern position by 180°.

6. The pattern forming method according to claim 2, wherein the pattern position is corrected by swinging the pattern position by 270°.

7. The pattern forming method according to claim 2, wherein the pattern position is corrected by shifting the pattern position in x- and/or y-directions and by swinging the pattern position.

8. The pattern forming method according to claim 2, wherein said substrate that is to be exposed is a wafer having a resist film formed thereon.

9. A pattern forming method, in which a main surface of a mask blank used to fabricate a photomask is exposed in a desired pattern to form a mask pattern on said mask blank, comprising the steps of:
   forming position measuring marks on at least two points on a main surface of said mask blank;
   processing a defect inspection using the defect inspection apparatus, if the inspection show at least one defect on the main surface of said mask blank and obtaining defect analysis data including at least the kind of said defect and the position of the defect relative to said position measuring marks;
   comparing the obtained defect position with the relative position of the mask pattern that is to be formed on the mask blank so as to select a mask pattern arranging position relative to the mask blank; and
   measuring the position measuring marks to calculate the exposure position and applying an exposure treatment to the selected position.

10. The pattern forming method according to claim 9, wherein the pattern arranging position is selected such that a defect is not positioned on an edge of the pattern.

11. The pattern forming method according to claim 9, wherein:
   said mask blank comprises a transparent substrate and a light shielding film formed on said transparent substrate and is used for fabrication of a photomask that is exposed as a mask with transmissive exposure;
   said defect includes a black type defect and a white type defect; and
   the pattern arranging position is selected such that said black type defect is buried in a light shielding film pattern, and said white type defect is exposed to a pattern opening that is not covered with said light shielding pattern.

12. The pattern forming method according to claim 9, wherein:

said mask blank comprises a supporting substrate, a reflecting film formed on said supporting substrate, and a light shielding film formed on said reflecting film;

said at least one defect comprises at least one defect that lowers the reflectivity; and the pattern arranging position is selected such that at least one of said defect lowering the reflectivity is buried in a non-reflecting pattern.

13. The pattern forming method according to claim 9, wherein the pattern position is corrected by shifting the pattern position in x- and/or y-directions.

14. The pattern forming method according to claim 9, wherein the pattern position is corrected by swinging the pattern position by 90°.

15. The pattern forming method according to claim 9, wherein the pattern position is corrected by swinging the pattern position by 180°.

16. The pattern forming method according to claim 9, wherein the pattern position is corrected by swinging the pattern position by 270°.

17. The pattern forming method according to claim 9, wherein the pattern position is corrected by shifting the pattern position in x- and/or y-directions and by swinging the pattern position.

18. The pattern forming method according to claim 9, wherein:

said mask blank comprises either: a supporting substrate and a light reflecting film on said supporting substrate, or a supporting substrate, a light reflecting film on said supporting substrate, and a light shielding film formed on said reflecting film and is used for fabrication of a photomask that is exposed as a reflection mask;

said defect comprises a defect that is located in said light reflecting film and lowers the reflectivity, a defect that is located in said light shielding film and lowers the shielding and is a defect in a reflective pattern, and a defect that is located on a surface or bottom of said light shielding film and that remains as a defect and lowers the reflectivity and is a defect in the reflective pattern; and the pattern arranging position is selected such that said defect that is located in said light reflecting film is positioned in a non-reflecting pattern portion, and said defect that is located in said light shielding film and lowers the shielding is positioned in a reflective pattern portion and said defect that is located on the surface or bottom of said light shielding film is positioned in a non-reflecting pattern portion; or a pattern arranging position for every defect is selected in a non-reflection pattern portion that is located in the middle position of said non-reflection pattern portion and is repaired by shielding material.

19. An exposure apparatus, comprising:

means for exposing a substrate surface in a desired pattern;

means for detecting a defect on the surface of said substrate;

means for analyzing the mutual positional relationship between the defect detected by said detecting means and a pattern that is to be formed on the surface of the substrate; and means for correcting the pattern position in the step of exposing the substrate surface in said pattern based on the result of the analysis.

20. The exposure apparatus according to claim 19, wherein:

said means for detecting a defect on the surface of the substrate includes a laser light source and a defect detector;

said means for analyzing said mutual positional relationship consists of a defect detecting-defect position calculating section; and said means for correcting the pattern position in the step of exposing the substrate surface in said pattern consists of a pattern arrangement shift treating section.

21. The exposure apparatus according to claim 20, wherein said pattern arrangement shift treating section performs at least one of shifting of the pattern position in x- and/or y-directions and swinging of the pattern position.

* * * * *